(12) United States Patent  (10) Patent No.: US 6,498,365 B1
Wakamiya                   (45) Date of Patent:     Dec. 24, 2002

(54) FET GATE OXIDE LAYER WITH GRADED NITROGEN CONCENTRATION

(75) Inventor: Mikio Wakamiya, Yokkaichi (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 21 days.

(21) Appl. No.: 09/667,793

(22) Filed: Sep. 22, 2000

(30) Foreign Application Priority Data

Sep. 24, 1999 (JP) .......................................... 11-271175

(51) Int. Cl.[7] .............................................. H01L 29/792
(52) U.S. Cl. ...................... 257/325; 257/314; 257/328; 438/212; 438/268
(58) Field of Search ................................. 257/314, 325, 257/328, 191, 101; 438/268, 212, 936, 37, 22

(56) References Cited

U.S. PATENT DOCUMENTS

| | | | | |
|---|---|---|---|---|
| 5,789,776 A | * | 8/1998 | Lancaster et al. | 257/296 |
| 5,969,397 A | * | 10/1999 | Grider, III et al. | 257/410 |
| 5,981,364 A | * | 11/1999 | Ramsbey et al. | 438/592 |
| 5,998,828 A | * | 12/1999 | Ueno et al. | 257/315 |
| 6,180,543 B1 | * | 1/2001 | Yu et al. | 438/787 |
| 6,246,607 B1 | * | 6/2001 | Mang et al. | 365/185.17 |
| 6,342,437 B1 | * | 1/2002 | Moore | 438/474 |

FOREIGN PATENT DOCUMENTS

| JP | 11-67760 | | 3/1999 | |
|---|---|---|---|---|
| JP | 11204793 A | * | 7/1999 | ........... H01L/29/78 |

OTHER PUBLICATIONS

Wolf, "Silicon Processing for the VLSI Era", 1990, Lattice Press, vol. 2, p. 635.*

* cited by examiner

Primary Examiner—Nathan J. Flynn
Assistant Examiner—Scott R. Wilson
(74) Attorney, Agent, or Firm—Oblon, Spivak, McClelland, Maier & Neustadt, P.C.

(57) ABSTRACT

A semiconductor device includes a semiconductor substrate; a gate oxide film made on the semiconductor substrate; and first transistors each having a first gate formed on the gate oxide film and a pair of source/drain formed in confrontation in the semiconductor substrate. The gate oxide film has a higher nitrogen concentration in its portion nearer to the first gates than that of its portion nearer to the semiconductor substrate.

8 Claims, 3 Drawing Sheets

FET GATE OXIDE LAYER WITH GRADED NITROGEN CONCENTRATION

BACKGROUND OF THE INVENTION

1. Field of the Invention

This invention relates to a semiconductor device and its manufacturing method, and more particularly, to those characterized in its process for making a gate oxide.

2. Related Background Art

NO or $N_2O$ gas is typically used as the source material gas for making a nitrogen oxide film as a process for manufacturing a semiconductor. In this case, a maximum peak of nitrogen concentration distribution is formed near a Si substrate.

However, since nitrogen has a fixed charge, there occurs the problem that, if the nitrogen concentration is too high, in the Si side, it causes transistors fluctuate in threshold value, and causes a decrease of the channel current.

Taking it into consideration, for the purpose of locating the peak of the nitrogen concentration away from a boundary face of the Si substrate, re-oxidation is required normally after the nitrogen oxide film is formed. In this case, however, a decrease in nitrogen quantity in the film due to the re-oxidation or non-uniform re-oxidation may cause deterioration of the gate reliability.

That is, it was difficult to arbitrarily control the nitrogen concentration and its distribution with conventional manufacturing methods of semiconductor devices.

On the other hand, upon making a gate oxide film of a flush memory, a nitrogen oxide film made by using $NH_3$ gas as the source material gas is often used.

In case of using $NH_3$ gas as the source material gas, the nitrogen profile in the resulting oxide film is characterized in having maximum peaks of the nitrogen concentration distribution both on the surface of the nitrogen oxide film and near the Si substrate. This property is effective for reducing trapping of electrons and holes in a device like a flush memory configured to injecting electrons from two directions, i.e. from its gate electrode and from the Si substrate.

However, the use of $NH_3$ as the source material gas causes the problem that hydrogen is introduced in addition to nitrogen into the nitrogen oxide film.

Since hydrogen behaves as an electron trapping site, it must be minimized to increase the reliability of the gate oxide film. For this purpose, it is necessary to insert re-oxidation after deposition of the nitrogen oxide film. In this case, however, an impurity doped into the Si substrate in a preceding step may spread and fluctuate the threshold voltage of the transistors, and may decrease the channel current. Furthermore, nitrogen may spread externally during the additional oxidation, which may decrease the nitrogen concentration near the surface of the nitrogen oxide film and may disable to obtain required electric properties.

That is, even when using $NH_3$ gas, it was still difficult to arbitrarily control the nitrogen concentration and its distribution with conventional manufacturing methods of semiconductor devices.

In conclusion, conventional manufacturing methods of semiconductor devices involved difficulties in arbitrarily controlling nitrogen concentration and its distribution because of employing the process of first fabricating a nitrogen oxide film by using NO, $N_2O$ or $NH_3$ gas and thereafter re-oxidizing it to make a gate oxide film.

SUMMARY OF THE INVENTION

It is therefore an object of the invention to provide a semiconductor device and its manufacturing method capable of controlling nitrogen concentration and its distribution by increasing the nitrogen concentration near its boundary face with an electrode in a process of making a nitrogen oxide film using a gate oxide film.

According to an aspect of the invention, there is provided a semiconductor device comprising:

a semiconductor substrate;

a gate oxide film formed on the semiconductor substrate; and first transistors each having a first gate formed on the gate oxide film and a pair of source/drain formed in confrontation in the semiconductor substrate, the gate oxide film having a higher nitrogen concentration in portions thereof nearer to the first gates than that of a portion thereof nearer to the semiconductor substrate.

In another aspect of the invention, the gate oxide film has a higher nitrogen concentration in a portion thereof near the first gate than in a portion thereof near the semiconductor substrate.

According to a further aspect of the invention, there is provided a method for manufacturing a semiconductor device including first transistors each having a first gate on a gate insulating film on a semiconductor substrate, in which the gate insulating film is fabricated by a process comprising:

a first step of making a first oxide film on the semiconductor substrate;

a second step of making a silicon film on the first oxide film;

a third step of making a first nitrogen oxide film on the silicon film;

a fourth step of segregating nitrogen along a surface of the first nitrogen oxide film; and a fifth step of oxidizing the silicon film to form a second nitrogen oxide film from the first oxide film, the silicon film and the first nitrogen oxide film.

According to a still further aspect of the invention, there is provided a method for manufacturing a semiconductor device including first transistors each having a first gate on a gate insulating film on a semiconductor substrate, in which the gate insulating film is fabricated by a process comprising:

a first step of making a first nitrogen oxide film on the semiconductor substrate;

a second step of making a silicon film on the first nitrogen oxide film;

a third step of making a second nitrogen oxide film on the silicon film;

a fourth step of segregating nitrogen along a bottom surface of the first nitrogen oxide film and along a top surface of the second nitrogen oxide film; and a fifth step of oxidizing the silicon film to form a third nitrogen oxide film from the first nitrogen oxide film, the silicon film and the second nitrogen oxide film.

DESCRIPTION OF THE PREFERRED EMBODIMENTS

Some embodiments of the invention are explained below with reference to the drawings.

FIRST EMBODIMENTS

FIGS. 1A through 1D are cross-sectional views of a semiconductor device under a manufacturing process. They shows a manufacturing method of a semiconductor device according to the first embodiment of the invention in the order of its steps.

Figure 1A:
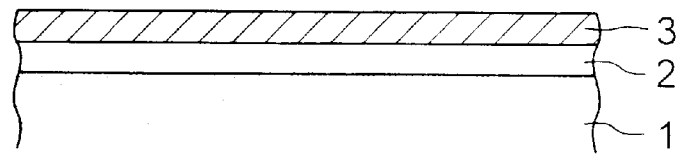
FIGS. 1A through 1D are cross-sectional views of a semiconductor device under a manufacturing process, which are used to explaining a manufacturing method of a semiconductor device according to the first embodiment of the invention, following its steps.

As shown in FIG. 1A, following an ordinary process, a thermal oxide film 2, about 60 angstrom thick, is formed as a gate oxide film on a silicon substrate 1, and a poly-silicon film or amorphous silicon film, about 20 angstrom thick, is stacked as a silicon film 3 on the thermal oxide film 2 by LP-CVD.

Figure 1B:
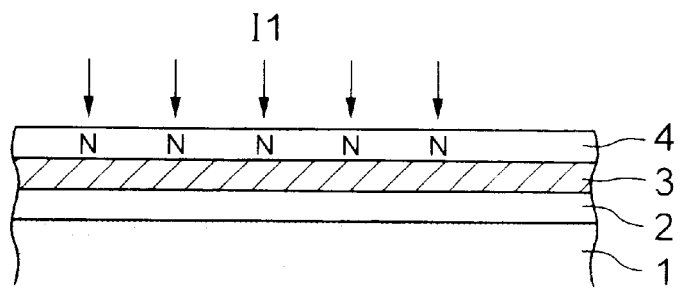

After that, as shown in FIG. 1B, NO or $N_2O$ gas is introduced as shown by I1 into a chamber controlled to maintain the temperature of 900° C. and the pressure of 400 Torr. As a result, the silicon oxide film 3 is oxidized, and nitrogen segregates along the surface of a nitrogen oxide film 4 stacked thereon. FIG. 1B schematically shows this status.

Figure 1C:
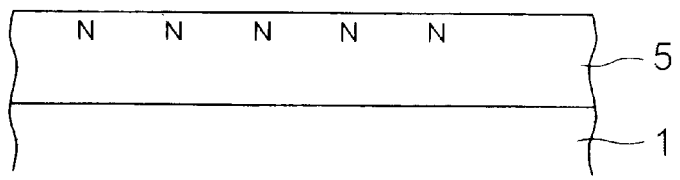

Under the condition, the supply of NO, $N_2O$ or $O_2$ gas is continued. As a result, the silicon film 3 is fully oxidized, and finally, a nitrogen oxide film 5, about 100 angstrom thick, appears on the silicon substrate 1 as shown in FIG. 1C. FIG. 1C shows this status schematically.

At that time, the maximum peak concentration of nitrogen is approximately 1 through 5 atomic % which is a concentration high enough to block diffusion of impurities from the gate electrode.

Figure 2:
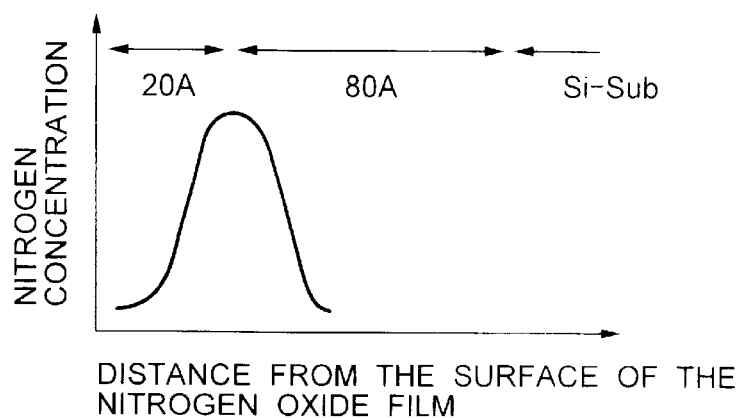
FIG. 2 is a diagram showing a nitrogen profile in a nitrogen oxide film made in the first embodiment.

FIG. 2 shows a nitrogen profile in the nitrogen oxide film made by the embodiment, and illustrates changes in nitrogen concentration with distance from the surface of the nitrogen oxide film, combining relations among the 20 angstrom thick silicon film 3, 80 angstrom thermal oxide film 2 and underlying silicon substrate 1. It will be apparent from FIG. 2 that the maximum peak of the nitrogen concentration distribution is located at a position distant by approximately 80 angstrom from the silicon substrate 1.

Figure 1D:
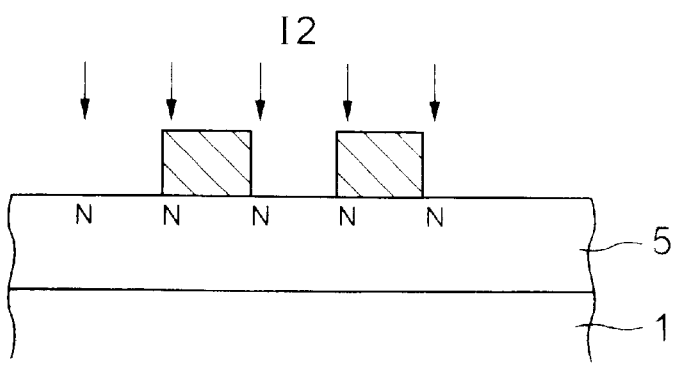

After that, as shown in Fig. 1D, following an ordinary process flow, a silicon film is stacked on the nitrogen oxide film 5. Then, as illustrated, it is processed into gate electrodes, and $BF_2$ is ion-implanted as shown by I2 for making sources and drains.

Thereafter, through a further known process, a flush memory, for example, is obtained as explained below.

In the embodiment shown here, gate electrodes are doped with B as the ion-implanted impurity, and the nitrogen oxide film 4 is used as the gate oxide film. Therefore, diffusion of the impurity toward the silicon substrate 1 via the gate oxide film does not occur in a later thermal process. Additionally, since the nitrogen concentration peak is distant from the silicon substrate 1, conventional problems, such as fluctuation of transistors in threshold value and decrease of the channel current, do not occur.

Although the thermal oxide film 2 used in the instant embodiment is 80 angstrom thick and the silicon film 3 is 20 angstrom thick, these values may be changed to modify the final thickness of the nitrogen oxide film and locate the maximum peak of the nitrogen concentration profile at a desired position.

Although the instant embodiment has been explained as setting the temperature for making the nitrogen oxide film at 900° C., it may be changed to any desirable temperature within the range from 600° C. to 1000° C. Also regarding the pressure, it is not limited to 400 Torr, but may be changed to any desirable value within the range from 1 through 760 Torr.

SECOND EMBODIMENT

A manufacturing method of a semiconductor device according to the second embodiment of the invention is configured similarly to the first embodiment to first stack a thermal oxide film, about 100 angstrom thick, as the gate oxide film on a silicon substrate, and thereafter sputter nitrogen plasma onto the surface of the thermal oxide film while supplying 1 SLM of $N_2$ gas for producing nitrogen from $N_2$ gas by using high frequency signal, keeping the wafer temperature at 400° C. and the chamber pressure t in 5 Torr. In this case, the maximum peak concentration of the nitrogen concentration profile is approximately 1 through 5 atomic %. Subsequently, annealing is conducted in an $O_2$ atmosphere at 900° C. to bind nitrogen and silicon. Thereafter, similarly to the first embodiment, following an ordinary process flow, the process proceeds with the steps of stacking a silicon film, processing it into gate electrodes and ion-implanting an impurity for making sources and drains.

Also the second embodiment, like the first embodiment, can prevent diffusion of the impurity toward the silicon substrate through the gate oxide film during a later thermal process, and can prevent fluctuation in threshold value of transistors and a decrease of the channel current, which were conventionally remarked as problems.

Although the waver temperature used in the instant embodiment is 400° C., it may be change appropriately within the range of 350° C. to 480° C. The pressure, as well, may be changed as desired within the range from 0.5 to 15 Torr. By appropriately changing these conditions, the final nitrogen concentration and the position of the maximum peak in the nitrogen concentration profile can be determined as desired.

Figure 3A:
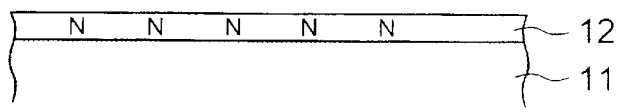
FIGS. 3A through 3C are cross-sectional views of a semiconductor device under a manufacturing process, which are used to explaining a manufacturing method of a semiconductor device according to the second embodiment of the invention, following its steps.
Figure 3B:
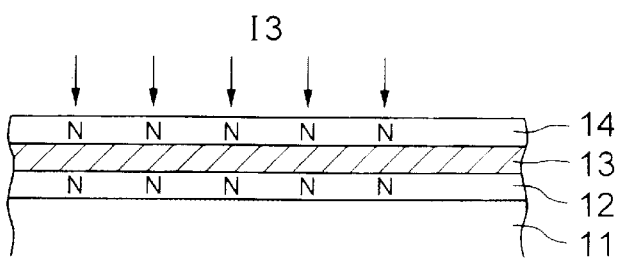
Figure 3C:
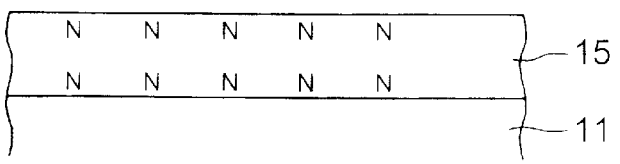

FIGS. 3A through 3C are cross-sectional views of a semiconductor device under a manufacturing process, which are used for explaining a manufacturing method of a semiconductor device according to the second embodiment of the invention. The second embodiment is directed to application of the invention to a manufacturing process of a tunneling oxide film in a flush memory, for example.

As shown in FIG. 3A, following an ordinary process, NO or $N_2O$ gas is introduced into a chamber controlled to maintain the temperature of 900° C. and the pressure of 400 Torr to stack a 20 angstrom thick nitrogen oxide film 12 on a silicon substrate 11. Subsequently, similarly to the first embodiment, a silicon film 13 is stacked to approximately 40 angstrom on the nitrogen oxide film 12 by LP-CVD.

After that, NO or $N_2O$ gas is again introduced as shown by l3 into the chamber held at the temperature of 900° C. and the pressure of 400 Torr to oxidize the silicon film 13 and stack a nitrogen oxide film 14.

As a result, nitrogen segregates along the boundary between the silicon substrate 11 and the nitrogen oxide film 12, and between the silicon film 13 and the nitrogen oxide film 14.

Thereafter, the supply of NO, $N_2O$ or $O_2$ gas is continued. As a result, the silicon film 13 is fully oxidized, and finally, a nitrogen oxide film 15, about 100 angstrom thick, appears on the silicon substrate 11 as shown in FIG. 3C.

Thereafter, through a known process, a flush-type nonvolatile memory, for example, is obtained.

Figure 4:
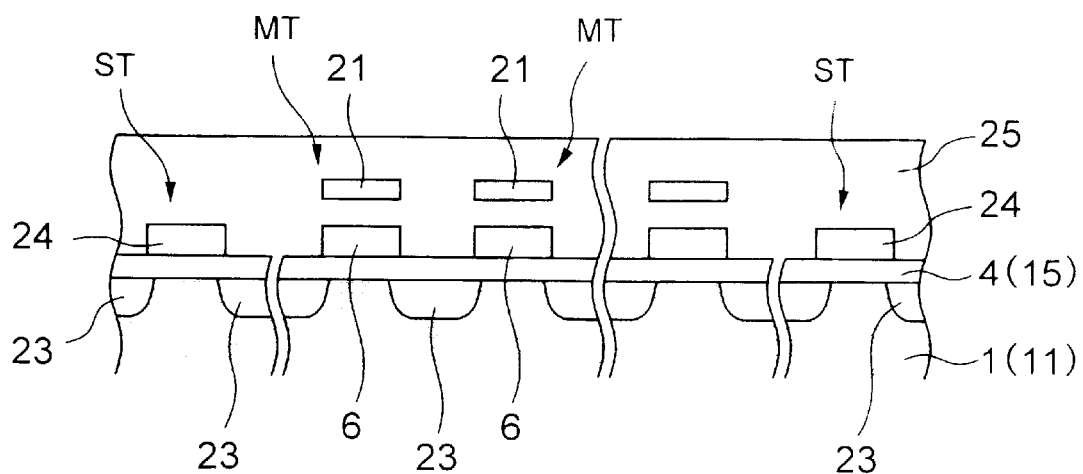
FIG. 4 is a diagram illustrating a flush-type nonvolatile memory obtained by the first and second embodiments.

FIG. 4 shows a configuration of the flush-type nonvolatile memory obtained by the first and second embodiments. In FIG. 4, a plurality of bits of nonvolatile memory transistors MT are formed in a central part, and selection transistors ST are formed on the opposite sides. In each memory transistor MT, numeral 6 denotes its floating gate, 21 denotes its control gate, and 23 denotes its source/drain. In each selection transistor ST, numeral 24 denotes its gate, and 23 denotes its source/drain. Numeral 4(15) denotes a gate insulating film, and 25 denotes an inter-layer insulating film. In this structure, the gate insulating film 4 or 15 is the element obtained by the first or second embodiment.

Figure 5:
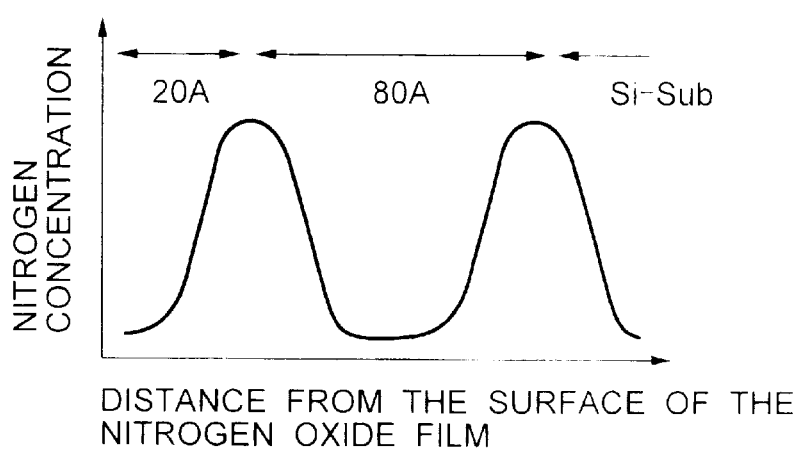
FIG. 5 is a diagram showing a nitrogen profile in a nitrogen oxide film by the same embodiment.

FIG. 5 shows a nitrogen profile in the nitrogen oxide film made by the same embodiment, and illustrates changes in nitrogen concentration with distance from the surface of the nitrogen oxide film, combining relations between the 100 angstrom thick nitrogen oxide film 15 and the underlying silicon substrate 11. It is apparent from FIG. 5 that the nitrogen concentration profile has two maximum peak positions, namely, the boundary face between the silicon substrate 11 and the nitrogen oxide film 15, and a position distant therefrom by approximately 80 angstrom.

After that, following an ordinary flow, the process is forwarded to the step of stacking a Si film to be processed to floating gates and a silicide film and the step of making or processing electrodes.

The nitrogen oxide film made by the embodiment using NO or $N_2O$ gas can be improved in electric properties because the hydrogen concentration in the film can be decreased as compared with that made by using $NH_3$ gas. Further, since the process according to the embodiment does not require the thermal process indispensable when using $NH_3$ gas to remove hydrogen, it is possible to overcome problems such as loss of nitrogen, which is remarked as a drawback of the process of removing hydrogen, fluctuation in threshold value of transistors due to diffusion of impurities into the silicon substrate, for example.

Additionally, although the instant embodiment stack the nitrogen oxide film 12, made in an initial step, to the thickness of 20 angstrom, and the silicon film 13 to 40 angstrom, the nitrogen oxide film 12, initially made, and the silicon film 13 may be changed in thickness to thereby finally obtain a desired thickness of the nitrogen oxide film and locate the maximum peak of the nitrogen concentration profile at a desired position.

Furthermore, also in the second embodiment, nitrogen may be doped. And, steps of the first embodiment may be combined with the second embodiment.

As described above, the manufacturing method of a semiconductor device proposed by the invention can control nitrogen concentration in the nitrogen oxide film to desirably locate its peak of peaks, and can prevent problems caused by a step of removing hydrogen by omitting this step, as compared with a process using $NH_3$ gas. Therefore, it is effective in improving electric properties of the gate oxide film.

The drawings used for the foregoing explanation are made for easier understanding of the invention, and dimensions thereof and elements therein are different from their actual sizes.

What is claimed is:

1. A semiconductor device comprising:

a semiconductor substrate;

a gate oxide film formed by a nitrogen oxide film and formed on said semiconductor substrate; and first transistors each having a first gate formed on said gate oxide film and a pair of source/drain formed in confrontation in said semiconductor substrate, said gate oxide film having a higher nitrogen concentration in portions thereof nearer to said first gates than that of a portion thereof nearer to the semiconductor substrate, the gate oxide film having a nitrogen concentration distribution exhibiting a profile which is a single-peaked pattern curve, the single peak being located in the first gate side surface of said gate oxide film, one of the bottoms of the curve being located under the surface of said gate oxide film and the other thereof being located in the central portion of the thickness of said gate oxide film.

2. The semiconductor device according to claim 1 wherein said gate oxide film has the maximum peak of nitrogen concentration distribution near each said first gate, and concentration as said maximum peak is approximately 1 through 5 atomic %.

3. The semiconductor device according to claim 1 wherein each said first transistor is a nonvolatile memory transistor, and has a second gate formed above said first gate via an insulating film.

4. The semiconductor device according to claim 3 wherein said semiconductor device is a NAND nonvolatile memory including:

an array of said first transistors arranged to commonly share each said source/drain between every two adjacent ones of said first transistors; and a second transistor arranged in one side and the other side of said first transistors.

5. The semiconductor device according to claim 4 wherein each said second transistor has a gate made of said gate oxide film.

6. The semiconductor device according to claim 2 wherein each said first transistor is a nonvolatile memory transistor, and a second gate is provided above said first gates via an insulating film.

7. The semiconductor device according to claim 6 wherein said semiconductor device is a NAND nonvolatile memory including:

an array of said first transistors arranged to commonly share each said source/drain between every two adjacent ones of said first transistors; and a second transistor arranged in one side and the other side of said first transistors.

8. The semiconductor device according to claim 7 wherein said second transistor has a gate made of said gate oxide film.

* * * * *